(12) United States Patent
Xie

(10) Patent No.: US 6,517,221 B1
(45) Date of Patent: Feb. 11, 2003

(54) HEAT PIPE HEAT SINK FOR COOLING A LASER DIODE

(75) Inventor: Bo Ping Xie, Laurel, MD (US)

(73) Assignee: Ciena Corporation, Linthicum, MD (US)

(*) Notice: Subject to any disclaimer, the term of this patent is extended or adjusted under 35 U.S.C. 154(b) by 357 days.

(21) Appl. No.: 09/595,832

(22) Filed: Jun. 16, 2000

Related U.S. Application Data
(60) Provisional application No. 60/139,848, filed on Jun. 18, 1999.

(51) Int. Cl.[7] .............................. B60Q 1/06; F21V 29/00
(52) U.S. Cl. ........................ 362/373; 362/259; 362/294; 372/35; 257/714
(58) Field of Search .............................. 362/259, 373, 362/294, 553, 580; 372/34, 35; 257/712–715, 722, 742, 706; 313/45; 165/104.33

(56) References Cited

U.S. PATENT DOCUMENTS

| | | | |
|---|---|---|---|
| 4,625,317 A | * 11/1986 | Kolb et al. | 372/107 |
| 4,847,841 A | * 7/1989 | Lamprecht et al. | 372/34 |
| 5,490,559 A | * 2/1996 | Dinulescu | 165/148 |
| 6,351,478 B1 | * 2/2002 | Heberle | 372/36 |

OTHER PUBLICATIONS

Garner, S.D., "Heat Pipes for Electronics Cooling Applications", Electronics Cooling, vol. 2, No. 3, 1996.

Lee, S., "Calculating Spreading Resistance in Heat Sink", Electronics Cooling, vol. 4, No. 1, 1998.

Lee, S., "How to Select a Heat Sink", Electronics Cooling, vol. 1, No. 1, 1995.

* cited by examiner

Primary Examiner—Sandra O'Shea
Assistant Examiner—Ali Alavi
(74) Attorney, Agent, or Firm—David L. Soltz; Michael R. Cammarata

(57) ABSTRACT

A heat sink module consistent with the present invention includes a heat pipe for efficient heat transfer heat away from a semiconductor pump laser. The heat pipe heat sink occupies less space than a conventional heat sink, and the condenser portion of the heat pipe heat sink can be easily manufactured using an extrusion process.

14 Claims, 3 Drawing Sheets

HEAT PIPE HEAT SINK FOR COOLING A LASER DIODE

This application claims the benefit of U.S. Provisional Patent Application Ser. No. 60/139,848 filed Jun. 18, 1999.

The present invention is directed toward a compact heat sink configured to cool a laser diode.

BACKGROUND OF THE INVENTION

Optical amplifiers are frequently provided in communication systems for boosting the power of attenuated optical signals. One type of optical amplifier includes an optical fiber doped with erbium, which is "pumped" with light at a selected wavelength, e.g., 980 nm and/or 1480 nm, to provide amplification or gain at the optical signal wavelength. A semiconductor laser often supplies the pump light to the erbium-doped fiber via an optical coupler.

In order to impart sufficient gain to optical signals input to the optical amplifier, semiconductor pump lasers usually output pump light at relatively high power. Accordingly, a high level of current is supplied to the laser to achieve the requisite level of pump light intensity, which, in turn causes the laser to generate a significant amount of heat. When the temperature of the pump laser changes, the wavelength of light emitted by the laser can change as well. Moreover, if the pump laser is housed within relatively close proximity to other temperature-sensitive optical and electrical components, which is often the case, heat generated by the pump laser can affect the performance of these additional components. While a conventional heat sink including, for example, a copper block, may effectively dissipate heat generated by the pump laser, the space occupied by such a heat sink can be excessive.

SUMMARY OF THE INVENTION

Consistent with the present invention, a compact heat sink is provided for effectively cooling a laser diode. The heat sink is particularly suitable for cooling a semiconductor pump laser diode.

BRIEF DESCRIPTION OF THE DRAWINGS

Advantages of the present invention will be apparent from the following detailed description of the presently preferred embodiments thereof, which description should be considered in conjunction with the accompanying drawings in which.

DETAILED DESCRIPTION

A heat sink module consistent with the present invention includes a heat pipe for efficient heat transfer heat away from a semiconductor pump laser. The heat pipe heat sink occupies less space than a conventional heat sink, and the condenser portion of the heat pipe heat sink can be easily manufactured using an extrusion process.

Figure 1:
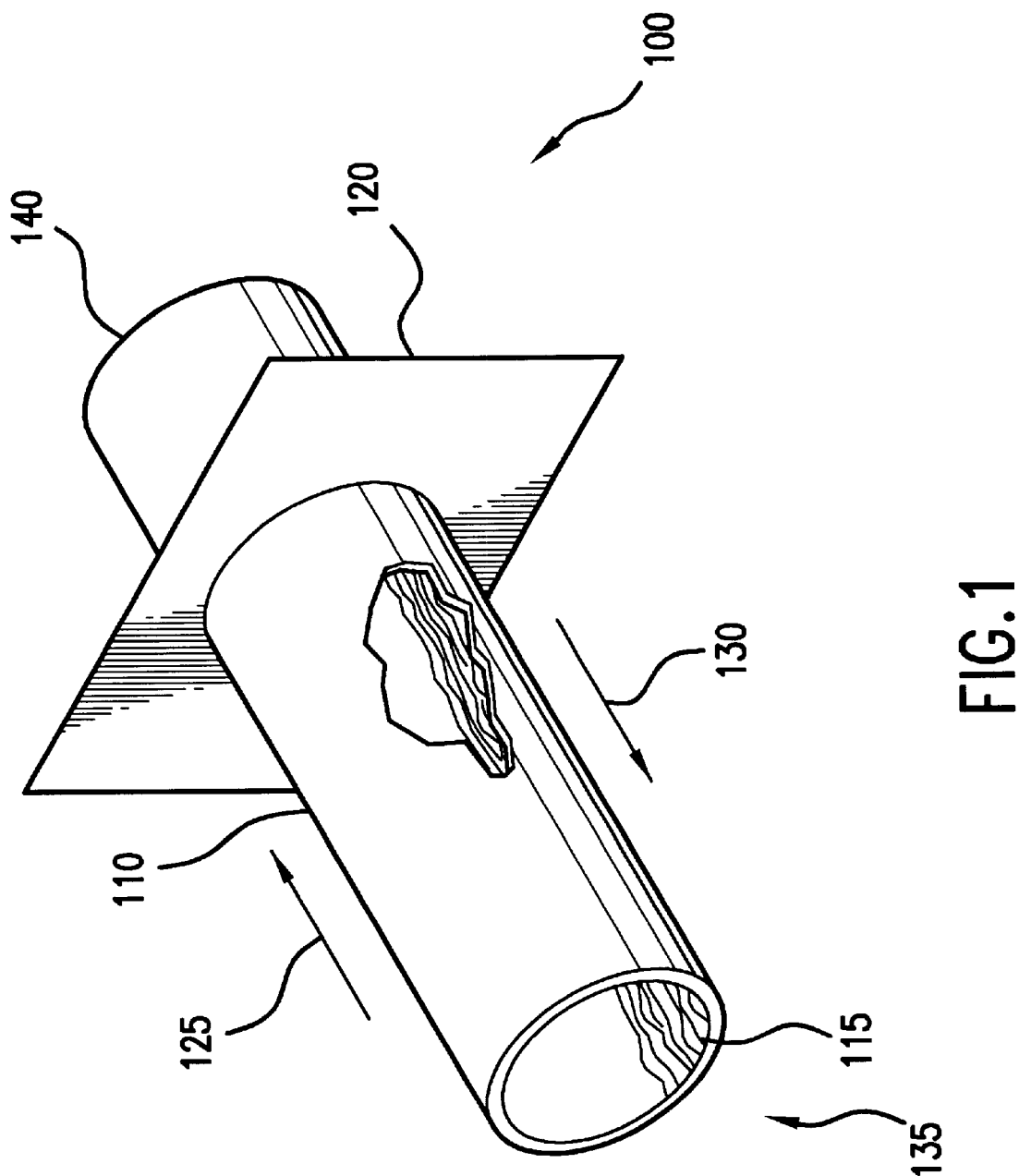
FIG. 1 illustrates a conventional heat pipe.

Turning to the drawings in which like reference characters indicate the same or similar elements in each of the several views, FIG. 1 illustrates a simplified view of a heat pipe 100 including a sealed tube 110, wick 115 and fin 120. Tube 110 is evacuated and then back filled with a "working fluid" such as water, sufficient to saturate wick 115. Under equilibrium conditions, a portion of the working fluid evaporates and remains in vapor form above the wick, while the rest of the working fluid is in liquid form within wick 115.

If a heat source is positioned adjacent end portion or evaporator portion 135 of tube 110, additional working fluid from wick 115 evaporates and migrates in a direction indicated by arrow 125 toward end portion or condenser portion 140, which is cooled by one or more fins 120. At or near end portion 140, the working fluid condenses, and is drawn through wick 115 by capillary attraction in a direction indicated by arrow 130 toward end portion 135. The working fluid continuously cycles through evaporation and condensation to efficiently remove heat away from end portion 135.

Figure 2:
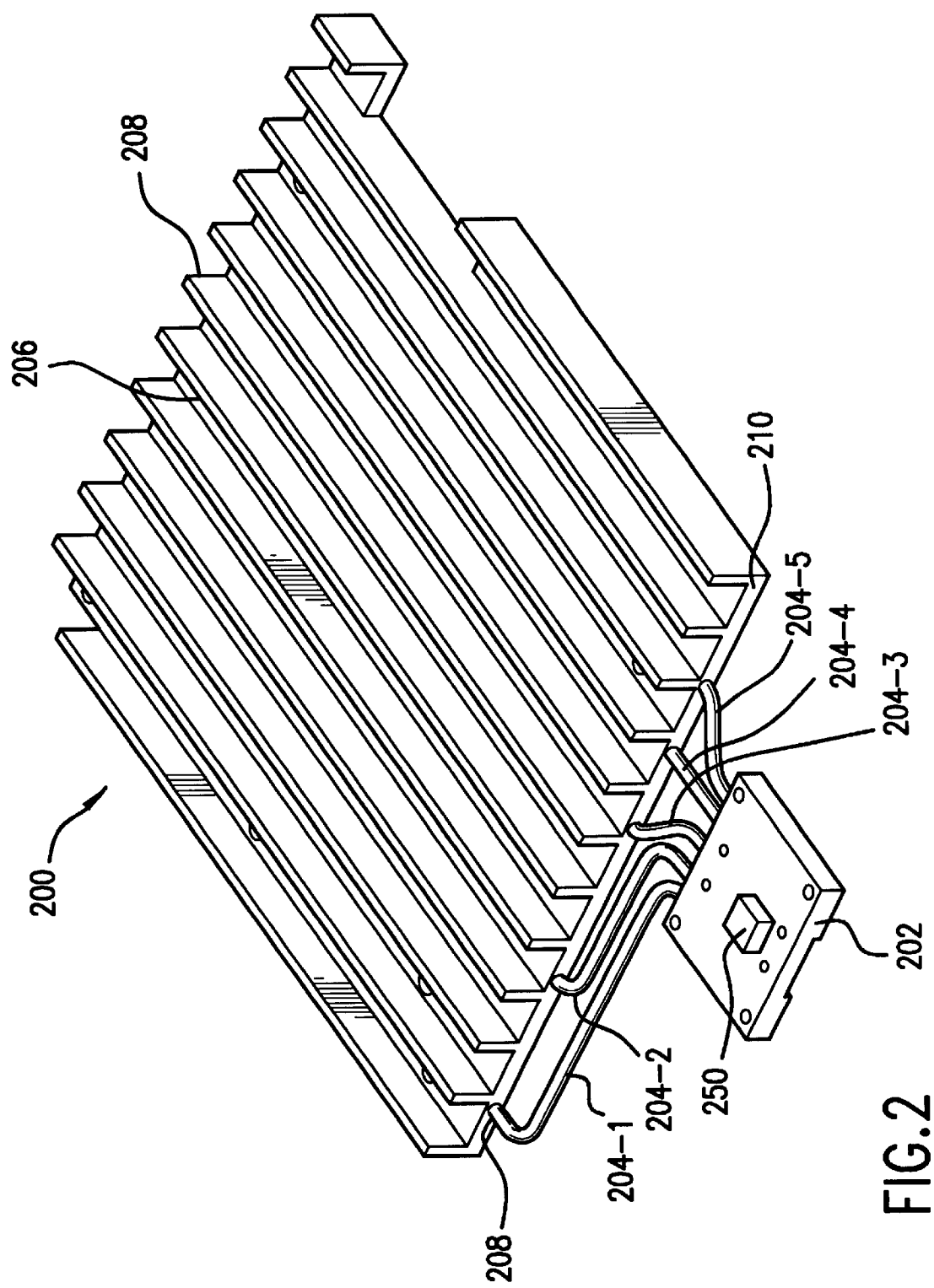
FIG. 2 illustrates a heat sink module consistent with the present invention.

FIG. 2 illustrates a heat sink module 200 in accordance with an aspect of the present invention. Heat sink module 200 includes a semiconductor laser 250, for example, disposed on an evaporator portion 202. Working fluid in evaporator 202 evaporates in response to heat generated by laser 250 and migrates to condenser portion 206 through a plurality of tubes 204-1 to 204-5, which pass through a corresponding one of grooves 208 in a base portion 210 of condenser 206. A plurality of fins 210 extend along base portion 210 to facilitate cooling within condenser portion 206.

Wicks, not shown, are disposed within tubes 204-1 to 204-5 for returning condensed working fluid to evaporator portion 202. Heat from laser 250 evaporates working fluid within the wick. The working fluid, in a manner similar to that described above, traverses through tubes to condenser portion 206 by radiating heat through fins 208.

Heat sink module 200 has reduced thermal spreading resistance due, at least in part, to the presence of the heat pipe structures. As is generally understood, spreading resistance is a measure of heat transfer capability of a material with a concentrated heat source. Materials having a low spreading resistance have a more uniform temperature distribution, a higher rate of heat dissipation from the material to the air, for example, for a given temperature gradient between the source and air. Since the heat sink module in accordance with the present invention has a relatively low spreading resistance, it takes up less space than a conventional heat sink, but can maintain the same laser diode temperature as a larger conventional heat sink.

In addition, base portion 210 and fins 208 can be formed of a single contiguous piece of aluminum, for example. The aluminum can thus be extruded in a conventional manner in order to form condenser portion 206. Accordingly, heat sink module 200 can be manufactured relatively inexpensively and in large quantities.

Figure 3:
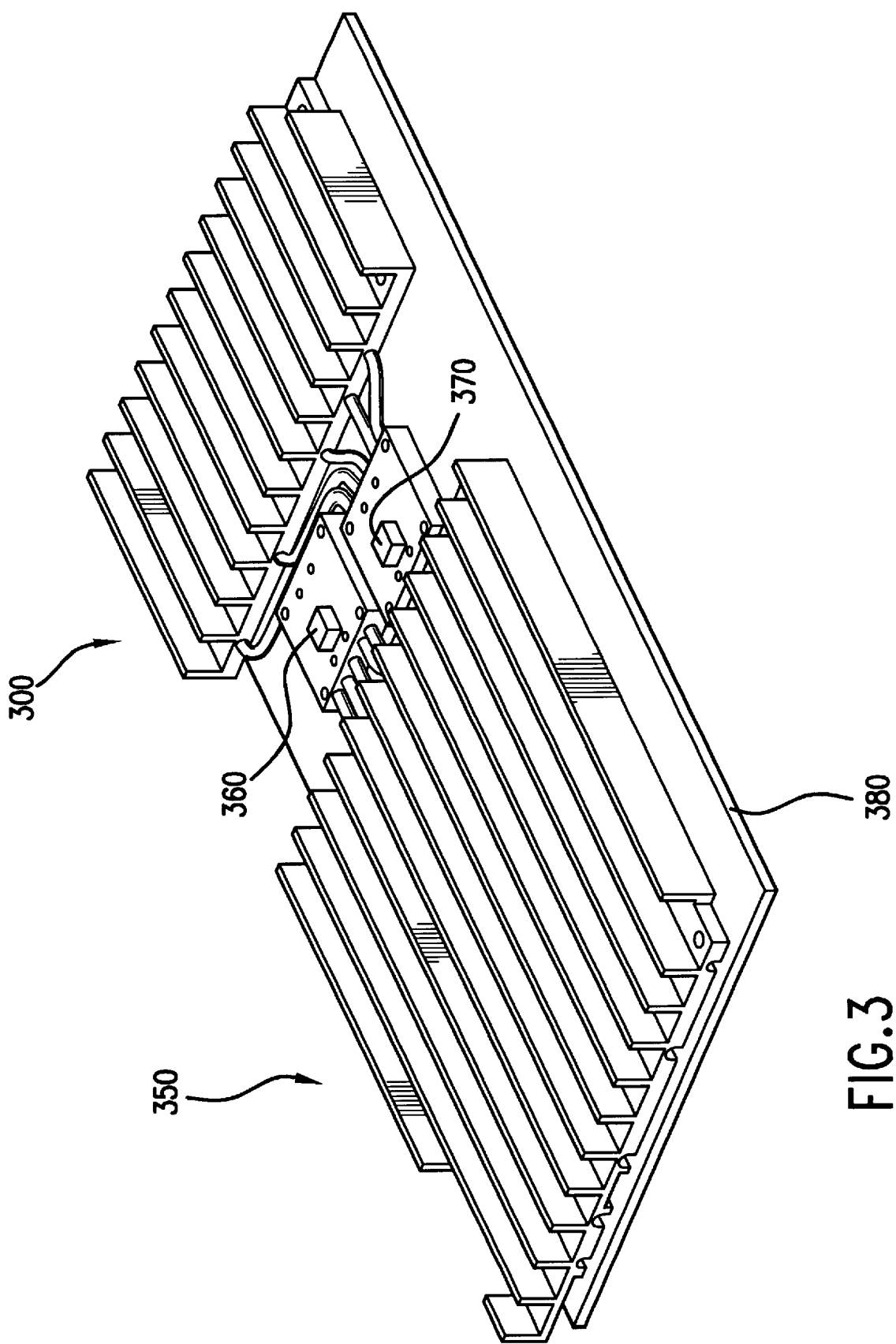
FIG. 3 illustrates a heat sink module consistent with a further aspect of the present invention.

FIG. 3 illustrates a further embodiment of the present invention including first and second heat sink modules 300 and 350 mounted on a substrate or printed circuit board 380 for cooling lasers 360 and 350, respectively. Modules 300 and 350 have a similar construction as module 200 shown in FIG. 2. In the example shown in FIG. 3, however, laser 360 emits more power than laser 370, and thus module 350 is larger in order to dissipate more heat than module 300.

It is noted that substrate 380, along with modules 300 and 350, can be mounted within a telecommunications "bay" or frame having a height, depth and width conforming to a NEBS (Network Equipment Building Standard), for example. The bay typically includes a plurality of shelves for accommodating one or more printed circuit boards or cards. The printed circuit boards, such as board 380, can be mounted vertically on a given shelf. In which case, module 350 should be disposed below module 300. Accordingly, due to thermal convection within the bay, module 350 is situated in a cooler area than module 300 in order to further dissipate the excess heat generated by module 350.

The above-described heat sink modules have reduced size and improved efficiency, and are thus well suited for cooling pump semiconductor lasers, as well other heat emitting components. While the foregoing invention has been described in terms of the embodiments discussed above, numerous variations are possible. Accordingly, modifications and changes such as those suggested above, but not limited thereto, are considered to be within the scope of Applicants' invention.

What is claimed is:

1. An optical device, comprising:
    a semiconductor laser, said semiconductor laser being configured to output light to pump an erbium doped fiber amplifier;
    a heat dissipating element coupled to said optical source, said heat dissipating element including a plurality of tubes, each of which being coupled to said optical source and including a thermally dissipating fluid, and a plurality of fins, each of which being coupled to a respective one of said plurality of tubes, said heat dissipating element being configured to regulate a temperature of said optical source.

2. An optical device in accordance with claim 1, wherein said semiconductor laser emits light at a wavelength of 1480 nm.

3. An optical device in accordance with claim 1, wherein said semiconductor laser emits light at a wavelength of 980 nm.

4. An optical device in accordance with claim 1, wherein said heat dissipating element includes a base portion, said semiconductor laser being provided on said base portion.

5. An optical device in accordance with claim 1 further comprising an additional semiconductor laser and an additional heat dissipating element, said additional heat dissipating element being configured to regulate a temperature of said additional semiconductor laser.

6. An optical device in accordance with claim 5, wherein said semiconductor laser, said heat dissipating element, and said additional heat dissipating element are provided on a common substrate.

7. An optical device in accordance with claim 1, wherein said plurality of fins constitute a single contiguous piece of metallic material.

8. An optical device in accordance with claim 7, wherein said metallic material includes aluminum.

9. An optical device in accordance with claim 1, wherein said plurality of fins constitute a single contiguous piece of extruded metallic material.

10. An optical device in accordance with claim 9, wherein said metallic material includes aluminum.

11. An optical device in accordance with claim 4, wherein said base portion and said plurality of fins constitute a single contiguous piece of metallic material.

12. An optical device in accordance with claim 11, wherein said metallic material include aluminum.

13. An optical device in accordance with claim 4, wherein said base portion and said plurality of fms constitute a single contiguous piece of extruded metallic material.

14. An optical device in accordance with claim 13, wherein said metallic material includes aluminum.

* * * * *